United States Patent [19]
DePuydt et al.

[11] Patent Number: 5,635,718
[45] Date of Patent: Jun. 3, 1997

[54] MULTI-MODULE RADIATION DETECTING DEVICE AND FABRICATION METHOD

[75] Inventors: James M. DePuydt, Stillwater; Nang T. Tran, Lake Elmo; James C. Brown, Brooklyn Center; Thomas J. Staiger, Hastings; John C. Dahlquist, Maplewood, all of Minn.; Meredith J. Williams, San Jose, Calif.

[73] Assignee: Minnesota Mining and Manufacturing Company, Saint Paul, Minn.

[21] Appl. No.: 585,507

[22] Filed: Jan. 16, 1996

[51] Int. Cl.⁶ ........................................ G01T 1/24
[52] U.S. Cl. ........................ 250/370.09; 250/208.1
[58] Field of Search ..................... 250/338.4, 370.09, 250/208.1, 352

[56] References Cited

U.S. PATENT DOCUMENTS

| | | | |
|---|---|---|---|
| 3,390,308 | 6/1968 | Marley | 317/100 |
| 4,467,342 | 8/1984 | Tower | 357/30 |
| 4,672,454 | 6/1987 | Cannella et al. | 358/213.11 |
| 4,694,317 | 9/1987 | Higashi et al. | 357/30 |
| 4,770,965 | 9/1988 | Fender et al. | 430/66 |
| 4,810,881 | 3/1989 | Berger et al. | 250/370.01 |
| 4,861,995 | 8/1989 | Ohgoda | 250/327.2 |
| 4,931,643 | 6/1990 | Amtmann | 250/327.2 |
| 5,065,245 | 11/1991 | Carnall, Jr. et al. | 250/208.1 |
| 5,105,087 | 4/1992 | Jagielinski | 250/370.09 |
| 5,127,038 | 6/1992 | Jeromin et al. | 378/28 |
| 5,148,265 | 9/1992 | Khandros et al. | 357/80 |
| 5,148,266 | 9/1992 | Khandros et al. | 357/80 |
| 5,182,624 | 1/1993 | Tran et al. | 257/40 |
| 5,248,885 | 9/1993 | Sato et al. | 250/370.15 |
| 5,254,480 | 10/1993 | Tran | 437/2 |
| 5,258,330 | 11/1993 | Khandros et al. | 437/209 |
| 5,289,631 | 3/1994 | Koopman et al. | 29/840 |
| 5,347,159 | 9/1994 | Khandros et al. | 257/692 |
| 5,436,458 | 7/1995 | Tran et al. | 250/370.09 |

OTHER PUBLICATIONS

Burke et al., "An Abuttable CCD Imager for Visible and X-Ray Focal Plane Arrays", *IEEE Transactions on Electron Devices*, vol. 38, No. 5, pp. 1069–1076 (May 1991).

Burke et al., "420 X 420 Charge–Coupled–Device Imager and Four Chip Hybrid Focal Plane", *Optical Engineering*, vol. 26, No. 9, pp. 890–896 (Sep. 1987).

Chan, William S., "Focal Plane Architecture: an Overview", *SPIE*, vol. 217, p. 207 (1980).

Harrison et al., "Large Area Focal Plane Comprising Charge–Coupled Devices and Fiber Optics", *Optical Engineering*, vol. 26, No. 9, pp. 897–901 (Sep. 1987).

Light et al., "Integrated Flex: Rigid–Flex Capability in a High Performance MCM", *IEEE Transactions on Components, Packaging, and Manufacturing Technology—Part B*, vol. 18, No. 1, pp. 47–52 (Feb. 1995).

IPC National Conference: Flex Circuits—Meeting the Challenge of the Next Generation of Packaging —Proceedings, Minneapolis, MN, May 16–17, 1995.

*Primary Examiner*—Carolyn E. Fields
*Attorney, Agent, or Firm*—Carolyn A. Bates; Steven J. Shumaker

[57] ABSTRACT

A multi-module radiation detecting device, a radiation detecting module for incorporation in a multi-module radiation detecting device, and a method for assembling a multi-module radiation detecting device are provided. The radiation detecting module includes a carrier substrate and a radiation detecting tile mounted over the carrier substrate. The module includes interconnection structure for connecting radiation detecting elements in the radiation detecting tile to conductive contacts on a base substrate. The module facilitates attachment and detachment of the module relative to the base substrate and relative to a test fixture used in test and burn-in operations. The module is constructed to isolate the radiation detecting tile from thermal and/or mechanical stresses produced at the interconnection interface during attachment and detachment for test and burn-in, assembly, and rework operations. As a result, the module can be used to produce a multi-module radiation detecting device having enhanced reliability. The module can help maintain device reliability despite rework operations, and can thereby reduce rework costs.

27 Claims, 4 Drawing Sheets

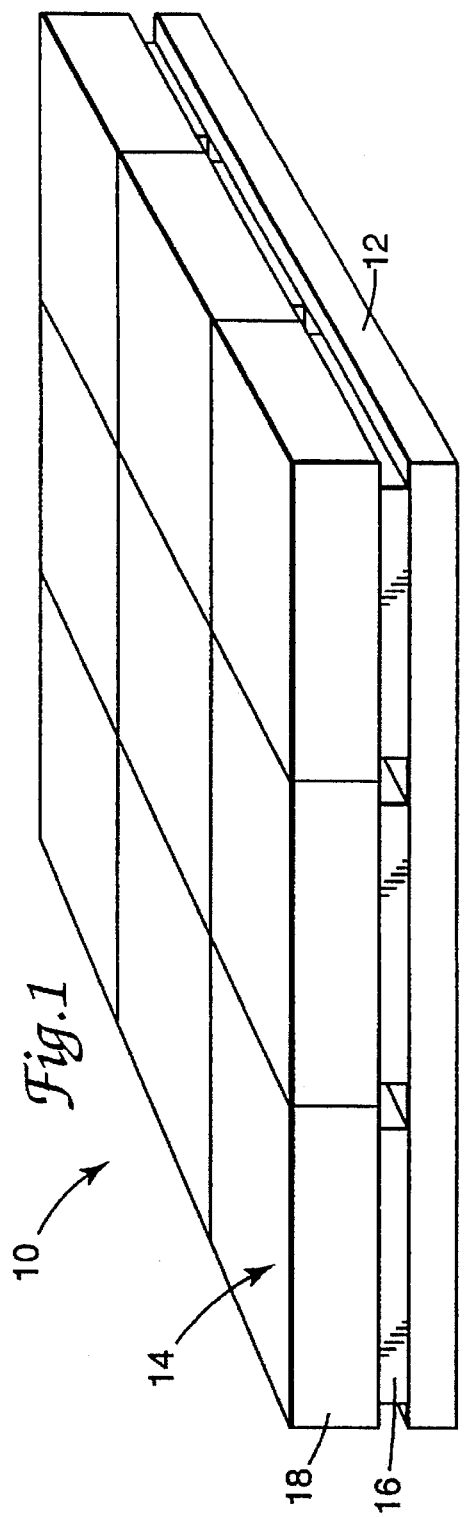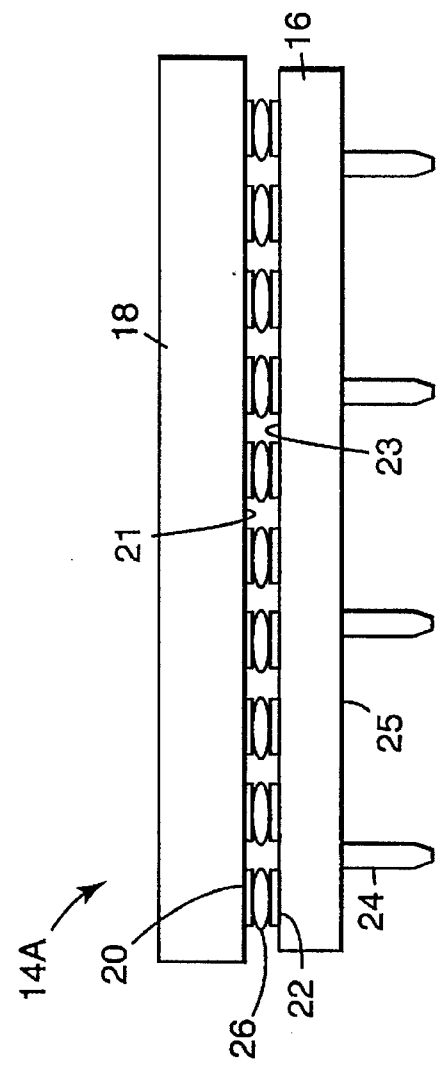

MULTI-MODULE RADIATION DETECTING DEVICE AND FABRICATION METHOD

FIELD OF THE INVENTION

The present invention relates generally to electronic device fabrication and, more particularly, to techniques for fabricating a multi-module radiation detecting device.

DISCUSSION OF RELATED ART

A radiographic image is formed by exposing an object under examination to X-ray radiation. The object modulates the X-ray radiation, producing a radiation pattern representative of the object. In conventional radiography, the radiation pattern is recorded as an image on a sheet of radiation-sensitive media such as silver halide or dry silver film. More recently, radiographic technology has begun to move toward digital acquisition. In particular, efforts have been made to replace the film used in conventional radiography with a solid state radiation detecting device, providing direct digital radiography.

A variety of solid state radiation detecting devices have been proposed. Some of the proposed solid state radiation detecting devices are described, for example, in U.S. Pat. No. 4,810,881 to Berger et al., U.S. Pat. No. 5,105,087 to Jagielinski, U.S. Pat. No. 5,235,295 to Tran et al., U.S. Pat. No. 5,254,480 to Tran, and U.S. Pat. No. 5,436,458 to Tran et al. Some of the proposed radiation detecting devices include an array of photodiodes. The photodiodes convert either X-ray radiation or light radiation received via a phosphor layer into electrical charge. The detecting devices also may incorporate one or more transistors with each photodiode to facilitate pixel addressing and charge sensing. Thus, the photodiode and transistor pairs form radiation detecting elements that detect X-ray radiation on a pixel-by-pixel basis. Another type of proposed device uses an array of transistors disposed adjacent a photoconductor layer. The photoconductor layer converts X-ray radiation into electrical charge that is sensed by the transistors. The photoconductor and transistors form radiation detecting elements that detect the electrical charge on a pixel-by-pixel basis.

One challenge common to each of the proposed approaches is the fabrication of a solid state radiation detecting device having an area large enough for particular radiographic applications. For example, a standard chest X-ray requires an imaging area of 14 inches by 17 inches (35.56 centimeters by 43.18 centimeters). The unavailability of larger area semiconductor wafers from integrated circuit foundries has limited the areas of the transistor arrays used in fabrication of solid state radiation detecting devices. Moreover, yield rapidly decreases with increasing area of the array. Thus, there exists a trade-off between yield and area. In view of such limitations, significant efforts have been directed to the fabrication of multi-module radiation detecting devices. A multi-module radiation detecting device comprises a plurality of individual detector modules or "tiles." The modules are assembled in an array to form a radiation detecting device having a larger overall area for radiographic applications such as chest X-rays.

In a multi-module detector, the modules typically are mounted together on a base substrate, commonly referred to as a "motherboard." The base substrate includes conductive contacts that are coupled to readout circuitry. The individual modules also include conductive contacts that are coupled to the radiation detecting elements. A direct solder connection typically is made between the contacts on the modules and the contacts on the base substrate. The direct solder connection presents two major problems. Specifically, the direct solder connection complicates test and burn-in of discrete modules prior to assembly, and makes removal, repair, and replacement of defective modules difficult after assembly.

The radiation detecting device is both complex and expensive. Therefore, it ordinarily is desirable to test each module prior to assembly on the base substrate. The number and density of conductive contacts on each module make it difficult to use probes for electrical continuity testing. For this reason, it is often desirable to mount each module in a test fixture for test and burn-in. Temporary attachment of the module in a test fixture generally is undesirable, however, due to the damage that could be caused to the module by additional soldering, desoldering, and cleaning steps. In addition, soldering, desoldering, and cleaning are time consuming processes that can lead to increased manufacturing costs. Further, after desoldering and cleaning, the module must be subjected to another soldering step for attachment to the base substrate.

If a module is damaged during assembly or suffers any bad solder connections with the base substrate, the module must be removed from the radiation detecting device. Failure of a module during use may also require removal. The module must be desoldered and the region of the base substrate in which the module was mounted must be cleaned prior to replacement of a new module. The close packing of adjacent modules greatly complicates such rework. To eliminate dead space, the gap between adjacent modules can be on the order of approximately 25 microns. During removal and replacement of a module, adjacent modules can suffer damage. In particular, the desoldering process can expose adjacent modules to excessive heat and can produce large stresses in the base substrate and in the modules. As a result, adjacent modules can be damaged and, in some cases, irreparably damaged, requiring removal. Similar potential for damage exists during installation of the new module. In addition, the base substrate must be cleaned prior to installation by removing or planarizing old solder and removing old flux residues. The lack of working space also complicates the cleaning operation.

In view of the foregoing problems associated with the attachment and detachment of radiation detecting modules in existing multi-module radiation detecting devices, there is a need for an improved radiation detecting module. In particular, there is a need for a radiation detecting module that reduces the potential for damage to the module and existing modules due to attachment and detachment during test and burn-in, assembly, and rework operations.

SUMMARY OF THE INVENTION

The present invention is directed to a multi-module radiation detecting device, a radiation detecting module for incorporation in a multi-module radiation detecting device, and a method for assembling a multi-module radiation detecting device. A radiation detecting module, in accordance with the present invention, includes a carrier substrate and a radiation detecting tile mounted over the carrier substrate. The module includes interconnection structure for connecting radiation detecting elements in the radiation detecting tile to conductive contacts on a base substrate. The module facilitates attachment and detachment of the module relative to the base substrate and relative to a test fixture used in test and burn-in operations. The module is constructed to isolate the radiation detecting tile from thermal and/or mechanical stresses produced at the interconnection interface during attachment and detachment for test and burn-in, assembly, and rework operations. As a result, the module can be used to produce a multi-module radiation detecting device having enhanced reliability. The module can help maintain device reliability despite rework operations, and can thereby reduce rework costs.

In one embodiment, the present invention makes use of a radiation detecting module that is mountable over a base substrate with a plurality of other radiation detecting modules to form an array of radiation detecting modules. The base substrate includes a plurality of first electrically conductive contacts. The radiation detecting module comprises a carrier substrate having a plurality of second electrically conductive contacts and a plurality of third electrically conductive contacts. The second contacts are electrically coupled to the third contacts of the carrier substrate and are configured for electrical coupling to the first contacts of the base substrate. The radiation detecting module further comprises a radiation detecting tile mounted over the carrier substrate. The radiation detector tile has a plurality of radiation detecting elements and a plurality of fourth electrically conductive contacts, the fourth contacts being electrically coupled to the radiation detecting elements and to the third contacts of the carrier substrate. The second, third, and fourth contacts are configured to electrically couple the radiation detector elements of the radiation detecting tile to the first contacts of the base substrate.

In another embodiment, the present invention makes use of a radiation detecting module that is mountable over a base substrate with a plurality of other radiation detecting modules to form an array of radiation detecting modules. The base substrate includes a plurality of first electrically conductive contacts. The radiation detecting module comprises a carrier substrate, and a flex circuit disposed over the carrier substrate. The flex circuit has a plurality of electrically conductive paths and a plurality of second electrically conductive contacts. Each of the second contacts is coupled to one of the conductive paths. The module further comprises a radiation detecting tile mounted over the flex circuit. The radiation detector tile has a plurality of radiation detecting elements and a plurality of third electrically conductive contacts. The third contacts are electrically coupled to the radiation detecting elements and to the second contacts of the flex circuit via the conductive paths of the flex circuit. The second contacts of the flex circuit are configured to electrically couple to the first contacts of the base substrate. The third contacts, the second contacts, and the conductive paths are configured to electrically couple the radiation detector elements of the radiation detecting tile to the first contacts of the base substrate.

The advantages of the present invention will be set forth in part in the description that follows, and in part will be apparent from the description, or may be learned by practice of the present invention. The advantages of the present invention will be realized and attained by means particularly pointed out in the written description and claims, as well as in the appended drawings. It is to be understood, however, that both the foregoing general description and the following detailed description are exemplary and explanatory only, and not restrictive of/the present invention, as claimed.

BRIEF DESCRIPTION OF THE DRAWINGS

The accompanying drawings are included to provide a further understanding of the present invention and are incorporated in and constitute a part of this specification. The drawings illustrate exemplary embodiments of the present invention and together with the description serve to explain the principles of the invention.

FIG. 1 is a perspective view of an exemplary multi-module radiation detecting device, in accordance with the present invention;

FIG. 2 is a side view of a first exemplary radiation detecting module useful in assembly of a multi-module radiation detecting device, in accordance with the present invention;

DETAILED DESCRIPTION OF THE PREFERRED EMBODIMENTS

Figure 3:
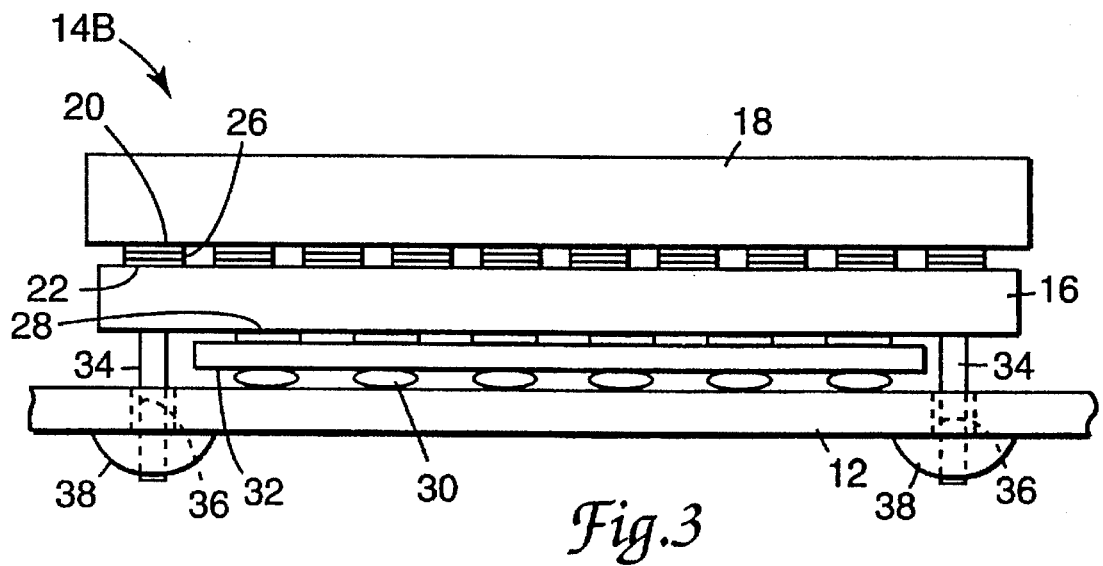
FIG. 3 is a side view of a second exemplary radiation detecting module useful in assembly of a multi-module radiation detecting device, in accordance with the present invention.

FIG. 1 is a perspective view of an exemplary multi-module radiation detecting device 10, in accordance with the present invention. As shown in FIG. 1, detecting device 10 includes a base substrate 12 and a plurality of radiation detecting modules 14 mounted over the base substrate in an array. Each of radiation detecting modules 14 includes a carrier substrate 16 and a radiation detecting tile 18 mounted over the carrier substrate. Each radiation detecting tile 18 includes an array of radiation detecting elements (not shown) for detecting radiation on a pixel-by-pixel basis. Each of the radiation detecting elements can be realized, for example, by a photodiode, the combination of one or more transistors and one or more photodiodes, or the combination of a transistor disposed adjacent a photoconductor layer. If desired, a conventional or structured phosphor layer may be added to tile 18. The radiation detecting elements convert radiation, such as X-ray radiation, into electrical signals. Each radiation detecting tile 18 is electrically coupled to conductive contacts on base substrate 12 via conductive paths either provided by or associated with carrier substrate 16. In this manner, the electrical signals generated by the radiation detecting elements can be routed via base substrate 12 to a digital data acquisition system.

The radiation detecting module 14 facilitates attachment and detachment of the module relative to base substrate 12 and relative to a test fixture used in test and burn-in operations. The module 14 is constructed to isolate radiation detecting tile 18 from thermal and/or mechanical stresses produced at the interconnection interface during attachment and detachment for test and burn-in, assembly, and rework operations. The carrier substrate 16 enables interconnection to be made indirectly between radiation detecting tile 18 and base substrate 12, reducing the potential for damage to the tile. As a result, module 14 can be used to produce a multi-module radiation detecting device 10 having enhanced reliability. The module 14 can help maintain device reliability despite rework operations, and can thereby reduce rework costs. The advantages provided by the construction of module 14 will be even more readily apparent from discussion of the modules shown in FIGS. 2–4.

FIG. 2 is a side view of a first exemplary radiation detecting module 14A useful in assembly of multi-module radiation detecting device 10, in accordance with the present invention. As shown in FIG. 2, module 14A includes carrier substrate 16 and radiation detecting tile 18. The radiation detecting tile 18 includes a plurality of electrically conductive contacts 20 on a major surface 21. The carrier substrate 16 includes a plurality of electrically conductive contacts 22 on a major surface 23 that opposes major surface 21 of radiation detecting tile 18. The major surface 23 of carrier substrate 16 may have an area sized slightly smaller than an area of major surface 21 of radiation detecting tile 18. In other words, each of the major dimensions of major surface 23 are smaller than the corresponding major dimensions of major surface 21. The carrier substrate 16 would be sized slightly smaller than radiation detecting tile 18 so that any registration error between the tile and the carrier substrate can be accommodated without interfering with subsequent alignment of adjacent modules 14A on base substrate 12. Alternatively, major surface 23 of carrier substrate 16 can be sized approximately equal to major surface 21 of radiation detecting tile 18 provided that the sides of the carrier substrate are beveled such that major surface 25 is smaller than major surface 21. In addition, carrier substrate 16 preferably has a coefficient of thermal expansion closely matched to that of radiation detecting tile 18 to avoid stresses that could result from excessive heat during soldering and desoldering. The side edges of radiation detecting tile 18 can be subjected to additional processing such as grinding, polishing, or beveling, as appropriate, to achieve desired gap dimensions, e.g., one to one-hundred microns, between adjacent tiles.

In the example of FIG. 2, contacts 20 and 22 comprise conductive contact pads. The contact pads 20, 22 are interconnected with solder balls 26. The surface tension of the solder balls 26 in the molten state helps to align contact pads 20, 22 relative to another. The carrier substrate 16 includes internal conductive traces (not shown) that electrically couple contact pads 22 to conductive contacts 24 on another major surface 2B of the carrier substrate opposite major surface 23. In FIG. 2, contacts 24 are realized by tapered conductive pins. The pins 24 are configured to engage conductive sockets (not shown) formed in base substrate 12. The pins 24 preferably are removably engaged with the sockets with a friction or spring-loaded fit. This type of engagement provides both electrical and mechanical coupling of module 14A to base substrate 12. Alternatively, pins 24 can be coupled to the sockets with solder joints. For testing and burn-in, pins 24 preferably are configured to removably engage conductive sockets formed in a test fixture. The module 14A can be simply "plugged" into the test fixture. Thus, testing and burn-in operations can be performed with a reduced number of steps and little risk of damage to radiation detecting tile 18. Even if solder connections are used for testing and burn-in, such connections are made to carrier substrate 16, which helps to isolate radiation detecting tile 18 from thermal and mechanical stresses.

The internal conductive traces formed in carrier substrate 16 can be accomplished with, for example, three layers of metallization. The metal layers can be patterned to form addressing lines, sensing lines, and DC current and provided with vias connecting contacts 22 and pins 24. The addressing, sensing, and DC current lines are electrically coupled to the radiation detecting elements in the radiation detecting tile via contacts 20, 22, and solder balls 26. A significant number of interconnections can be made internally within carrier substrate 16 to electrically couple at least some of the contacts 20 via contacts 22 to common pins 24. Multiplexing circuitry can be incorporated within carrier substrate to help reduce the number of pins 24. The addressing and sensing lines associated with pins 24 then can be multiplexed to activate individual radiation detecting elements coupled to common pins. The number of pins 24 can be much less than the number of contacts 20, 22. In this manner, the number of interconnections between carrier substrate 16 and base substrate 12 can be greatly reduced, relative to the number of interconnections between the carrier substrate and radiation detecting tile 18. It is contemplated, for example, that the number of pins 24 can be more than a factor of ten smaller than the number of contacts 20, 22. The reduced number of pins 24, and thus the reduced number of interconnections between carrier substrate 16 and base substrate 12, greatly facilitates attachment and detachment for test and burn-in, assembly, and rework operations.

FIG. 3 is a side view of a second exemplary radiation detecting module 14B useful in assembly of a multi-module radiation detecting device 10, in accordance with the present invention. Like module of FIG. 2, module 14B includes a carrier substrate 16 and a radiation detecting tile 18 mounted over the carrier substrate. Further, contacts 20 on radiation detecting tile 18 can be coupled to contacts 22 on carrier substrate 16 with solder balls, thereby coupling radiation detecting elements within the radiation detecting tile to the contacts on the carrier substrate.

Unlike module 14A of FIG. 2, module 14B includes alternative means for coupling carrier substrate 16 to base substrate 12. In particular, conductive contacts 28 of module 14B and conductive contacts 30 of base substrate 12 are electrically coupled to one another via an elastomeric interposer 32 disposed between the base substrate and the carrier substrate. The elastomeric interposer 32 provides a plurality of conductive paths that couple contacts 28 and contacts 30. The elastomeric interposer 32 preferably comprises a z-axis conductive elastomer. The z-axis conductive elastomer can be tacky or non-tacky. A z-axis conductive elastomer will provide conductive paths extending in only a single dimension in response to pressure applied along that dimension. The contacts 30 of base substrate 12 and/or contacts 28 of carrier substrate 16 may comprise conductive bumps that enhance coupling pressure between the respective contacts and elastomeric interposer 32.

The module 14B preferably includes a mechanical fastener that mechanically couples carrier substrate 16 to base substrate 12. As shown in FIG. 3, the mechanical fastener may comprise, for example, one or more pins 34 that extend through apertures 36 in base substrate 12. The pins 34 can be fixed in the apertures with a bead of solder 38 or epoxy, as shown in FIG. 3, or threaded and secured with a small nut or other fastening device. A test fixture can be configured to accept pins 34, providing ease of attachment and detachment of module 14B for test and burn-in operations. An alternative mechanical fastener such as a clamping mechanism could be provided in the test fixture to facilitate attachment and detachment of module 14B.

As in the example of FIG. 2, carrier substrate 16 may have a major surface area sized slightly smaller than a major surface area of radiation detecting tile 18 to enable accommodation of registration error. In addition, carrier substrate 16 preferably has a coefficient of thermal expansion closely matched to that of radiation detecting tile 18 to avoid stresses. Again, carrier substrate 16 includes internal conductive traces (not shown) that electrically couple the solder interconnected contacts 20, 22 of radiation detecting tile 18 and the carrier substrate, respectively, to contacts 28. Further, interconnections can be made and multiplexer circuitry incorporated internally within carrier substrate 16 to reduce the number of contacts 28 for interconnection to contacts 30 of base substrate 12.

Figure 4:
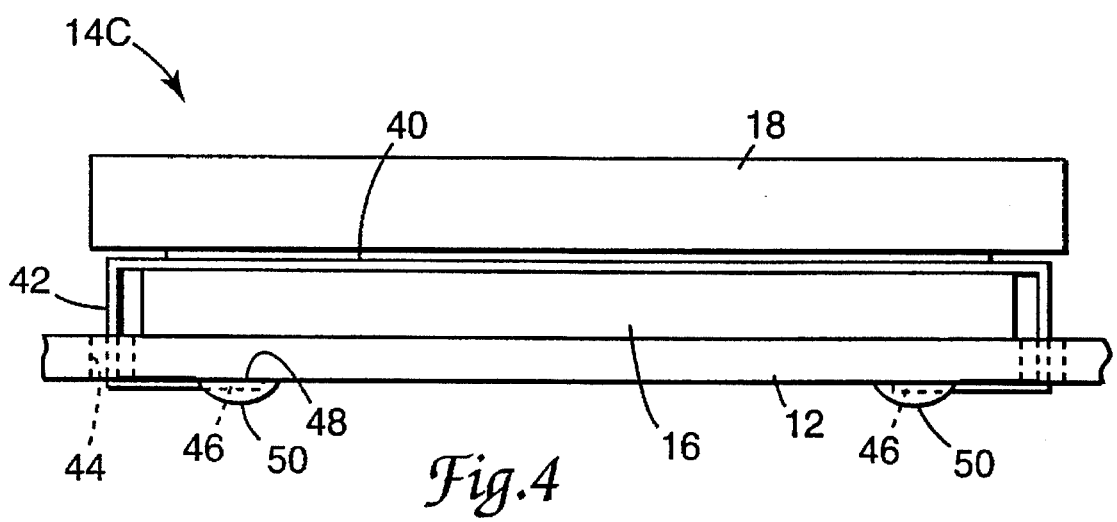
FIG. 4 is a side view of a third exemplary radiation detecting module useful in assembly of a multi-module radiation detecting device, in accordance with the present invention.

FIG. 4 is a side view of a third exemplary radiation detecting module 14C useful in assembly of a multi-module radiation detecting device 10, in accordance with the present invention. Once again, module 14C includes a carrier substrate 16 and a radiation detecting tile 18 mounted over the carrier substrate. Disposed between carrier substrate 16 and radiation detecting tile 18, however, is a flex circuit 40. At least a portion of flex circuit 40 can be affixed to carrier substrate 16. The carrier substrate 16 is disposed in contact with base substrate 12 and provides mechanical support for radiation detecting tile 18 and flex circuit 40. For this reason, carrier substrate 16 preferably is substantially rigid relative to flex circuit 40. The carrier substrate 16 can be sized slightly smaller than tile 18. The carrier substrate 16 also can be selected to match the thermal expansion coefficient of radiation detecting tile 18. However, carrier substrate 16 in module 14C does not serve to couple contacts on radiation detecting tile 18 to contacts on base substrate 12. Instead, flex circuit 40 serves to couple contacts on radiation detecting tile 18 to contacts on base substrate 12.

The flex circuit 40 includes a plurality of first conductive contacts, a plurality of electrically conductive paths, and a plurality of second conductive contacts. The first and second contacts of flex circuit 40 are coupled to one another via the conductive paths. The radiation detecting tile 18 is mounted over flex circuit 40. The conductive contacts (not shown in FIG. 4) of radiation detecting tile 18 are electrically coupled to the radiation detecting elements in the tile and to the second contacts of flex circuit 40 via the first contacts and the conductive paths of the flex circuit. The contacts on tile 18 can be coupled to the first contacts of flex circuit 40 with, for example, solder, tape automated bonding (TAB), thermosonic bonding, or conductive adhesive. The second contacts of flex circuit 40 can be electrically coupled to the contacts of base substrate 12 in a similar fashion. Thermosonic bonding is described, for example, in Microelectronics Packaging Handbook, Rao Tuumala, Van Nostrand—Reinhold (1982), pages 391–393. The TAB process is described, for example, in the above Tuumala book, at page 1151. In the above manner, the first contacts, conductive paths, and second contacts of flex circuit 40, and the contacts of radiation detecting tile 18 electrically couple the radiation detector elements in the tile to the contacts of base substrate 12.

As shown in FIG. 4, flex circuit 40 includes at least one base substrate coupling portion 42, which may take the form of a flexible, tab-like member. The base substrate coupling portion 42 preferably has a width that is less than a width of radiation detecting tile 18. The second contacts of flex circuit 40 are disposed on base substrate coupling portion 42. The base substrate coupling portion 42 extends to a position proximal to the contacts of base substrate 12. In the example of FIG. 4, the contacts are disposed on a side of base substrate 12 opposite carrier substrate 16. The base substrate 12 includes at least one slot-like aperture 44, and base substrate coupling portion 42 extends through the aperture to the position proximal to the contacts of the base substrate. The base substrate coupling portion 42 may include a bent portion 46 that extends substantially parallel to the major surface plane of base substrate 12. The second contacts of flex circuit 40 are provided on bent portion 46 and are coupled to the contacts, indicated by reference numeral 48, of base substrate 12. The respective contacts of base substrate coupling portion 42 and base substrate 12 can be coupled with, for example, solder, as indicated by reference numeral 50, or by tape automated bonding (TAB), thermosonic bonding, or conductive adhesive.

The conductive paths of flex circuit 40 can be configured to provide addressing, sensing, and DC current lines. In addition, the conductive paths of flex circuit 40 can be configured to electrically couple the contacts of radiation detecting tile 18 and the first contacts of the flex circuit to common second contacts, thereby reducing the number of contacts for interconnection between base substrate coupling portion 42 and base substrate 12. A test fixture can be constructed in a manner similar to base substrate 12 to include, for example, apertures for receiving base substrate coupling portion 42. The bent portions 46 can be soldered to contacts on the test fixture or mechanically held against such contacts, facilitating attachment and detachment of module 14C for test and burn-in operations.

Figure 5:
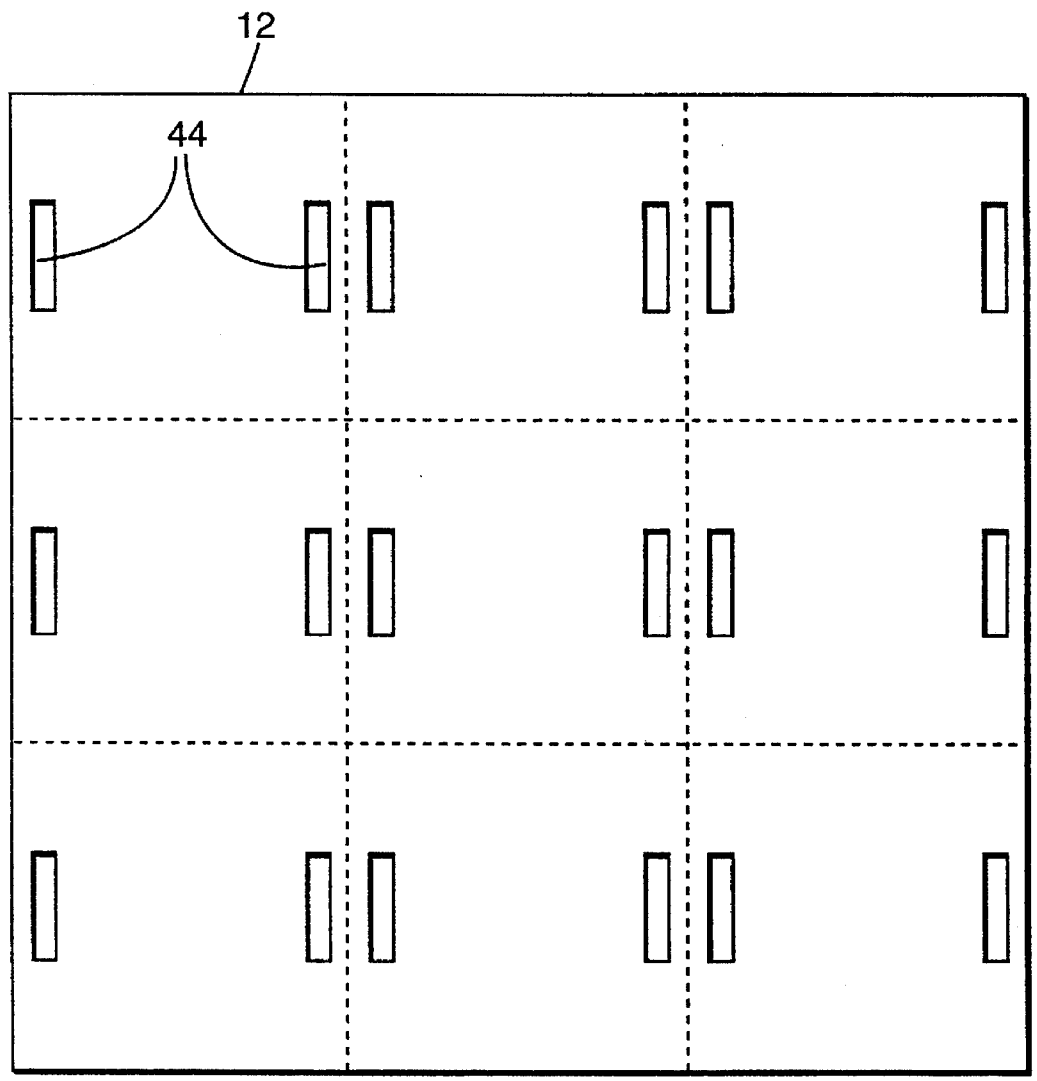
FIG. 5 is a plan view illustrating assembly of a multi-module radiation detecting device, in accordance with the present invention.

FIG. 5 is a plan view illustrating an exemplary base plate 12 for assembly of a multi-module radiation detecting device 10 with module 14C of FIG. 4, in accordance with the present invention. As shown in FIG. 4, a plurality of modules 14C can be assembled in an array across base plate 12. The carrier substrate 16 associated with each module 14C would reside on base plate 12. The base plate coupling portions 42 of such modules 14C can be inserted into apertures 44. The contacts carried by bent portions 46 then can be soldered to contacts on base plate 12.

Figure 6:
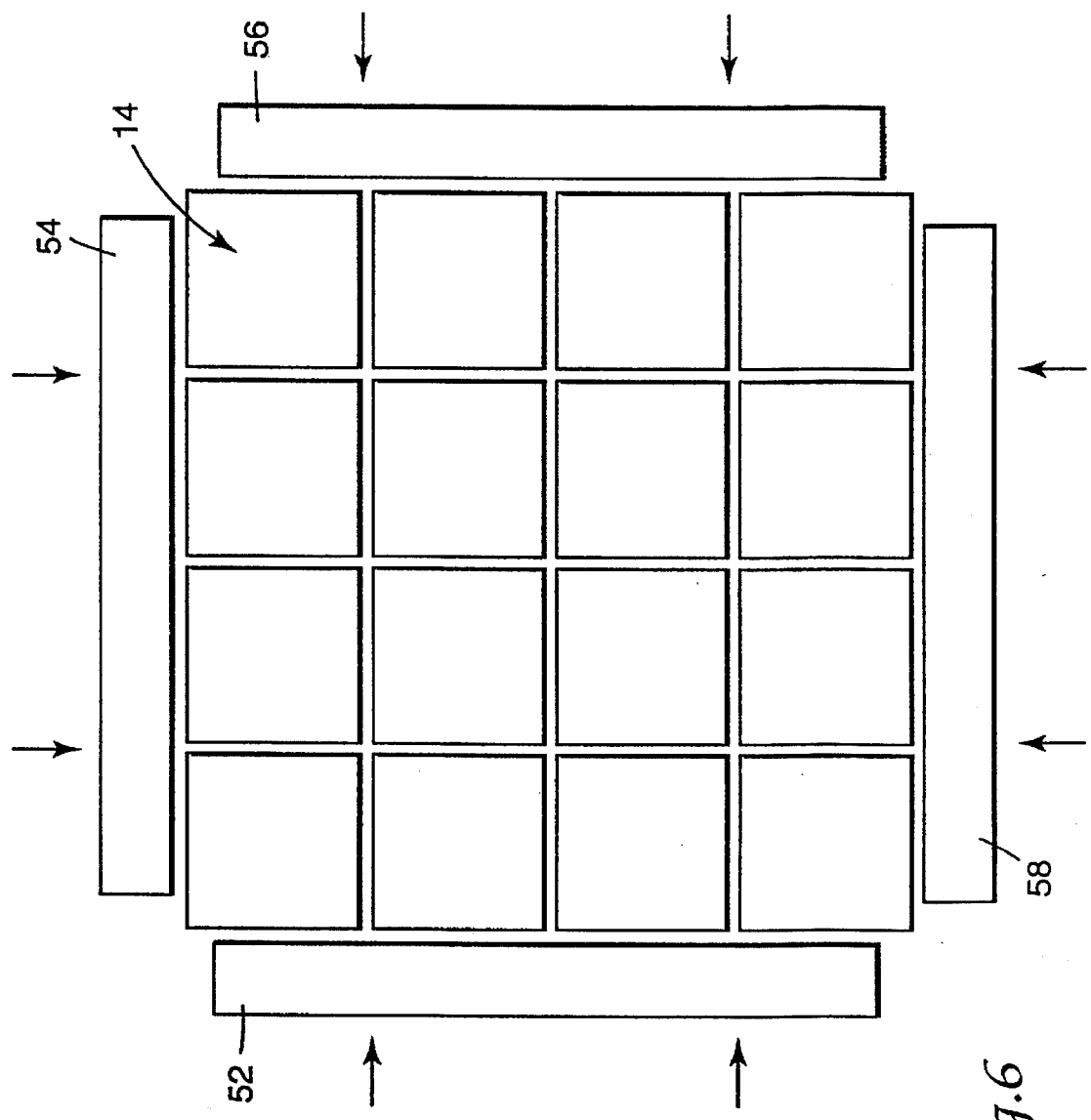
FIG. 6 is a plan view illustrating an exemplary base plate for assembly of a multi-module radiation detecting device with the module of FIG. 4, in accordance with the present invention.

FIG. 6 is a plan view illustrating assembly of a multi-module radiation detecting device 10, in accordance with the present invention. A plurality of radiation detecting modules 14, such as any of those described with respect to FIGS. 2–4, are assembled in a two-dimensional array over a support. The modules 14 are assembled "upside-down" such that radiation detecting tiles 18 rest on the support. As shown in FIG. 6, the two-dimensional array of modules 14 has four peripheral sides 52, 54, 56, 58. A force is applied to each of peripheral sides 52, 54, 56, 58 of the two-dimensional array of modules 14 to align the radiation detecting modules relative to one another. The force can be applied via bars that extend along each side 52, 54, 56, $8. The bars can be moved independently in direction perpendicular to the sides with which they are associated. In this manner, modules 14 are aligned to provide uniform gapping between adjacent modules. Once modules 14 are properly aligned, base substrate 12 is mounted over the array. The contacts provided on carrier substrate 16 are electrically coupled to the contacts provided on base substrate, and any mechanical fastener is put in place. The overall radiation detecting device 10, including the array of modules 14 and base substrate 12, then is removed from the support, completing the assembly process.

Having described the exemplary embodiments of the invention, additional advantages and modifications will readily occur to those skilled in the art from consideration of the specification and practice of the invention disclosed herein. Therefore, the specification and examples should be considered exemplary only, with the true scope and spirit of the invention being indicated by the following claims.

What is claimed is:

1. A multi-module radiation detecting device comprising:
   a base substrate having a plurality of first electrically conductive contacts;
   a plurality of radiation detecting modules mounted over the base substrate in an array, each of the radiation detecting modules including:

a carrier substrate having a plurality of second electrically conductive contacts and a plurality of third electrically conductive contacts, the second contacts being electrically coupled to the first contacts of the base substrate and to the third contacts of the carrier substrate, and a radiation detecting tile mounted over the carrier substrate, the radiation detecting tile having a plurality of radiation detecting elements and a plurality of fourth electrically conductive contacts, the fourth contacts being electrically coupled to the radiation detecting elements and to the third contacts of the carrier substrate, wherein the second, third, and fourth contacts electrically couple the radiation detecting elements of the radiation detecting tile to the first contacts of the base substrate.

2. The device of claim 1, wherein the first contacts of the base substrate include conductive sockets and the second contacts of the carrier substrate include conductive pins engaging the sockets.

3. The device of claim 2, wherein the pins are coupled to the sockets with solder.

4. The device of claim 2, wherein the conductive sockets and the conductive pins are removably engaged with one another.

5. The device of claim 1, wherein the third contacts of the carrier substrate and the fourth contacts of the radiation detecting tile are electrically coupled with solder.

6. The device of claim 1, wherein the first contacts of the base substrate and the second contacts of the carrier substrate are coupled via an elastomeric interposer disposed between the base substrate and the carrier substrate, the interposer providing a plurality of conductive paths that couple the first contacts and the second contacts.

7. The device of claim 6, wherein the elastomeric interposer comprises a z-axis conductive elastomer.

8. The device of claim 6, wherein at least one of the first contacts of the base substrate and the second contacts of the carrier substrate comprises conductive bumps, the conductive bumps enhancing coupling pressure between the first contact, the second contacts, and the elastomeric interposer.

9. The device of claim 1, further comprising a mechanical fastener that mechanically couples the carrier substrate to the base substrate.

10. The device of claim 1, wherein the third contacts of the carrier substrate are disposed on a first major surface of the carrier substrate and the fourth contacts of the radiation detecting tile are disposed on a first major surface of the radiation detecting tile, the first major surface of the carrier substrate and the first major surface of the radiation detecting tile opposing one another, and wherein the first major surface of the carrier substrate has an area less than an area of the first major surface of the radiation detecting tile.

11. The device of claim 1, wherein the third contacts of the carrier substrate are disposed on a first major surface of the carrier substrate and the fourth contacts of the radiation detecting tile are disposed on a first major surface of the radiation detecting tile, the first major surface of the carrier substrate and the first major surface of the radiation detecting tile opposing one another, and wherein the first major surface of the carrier substrate has an area approximately equal to an area of the first major surface of the radiation detecting tile, and wherein sides of the carrier substrate are beveled such that a second major surface of the carrier substrate has an area smaller than the area of the first major surface of the radiation detecting tile.

12. The device of claim 1, wherein at least some of the fourth contacts of the radiation detecting tile are coupled via the third contacts to common second contacts, and wherein the number of each of the second contacts and first contacts is less than the number of the fourth contacts.

13. A multi-module radiation detecting device comprising:

a base substrate having a plurality of first electrically conductive contacts;

a plurality of radiation detecting modules mounted over the base substrate in an array, each of the radiation detecting modules including:

a carrier substrate disposed in contact with the base substrate, a flex circuit disposed over the carrier substrate, the flex circuit having a plurality of electrically conductive paths, a plurality of second electrically conductive contacts, and a plurality of third electrically conductive contacts, wherein the second contacts and third contacts are coupled to one another via the conductive paths, a radiation detecting tile mounted over the flex circuit, the radiation detecting tile having a plurality of radiation detecting elements and a plurality of fourth electrically conductive contacts, the fourth contacts being electrically coupled to the radiation detecting elements and to the third contacts of the flex circuit via the second contacts and the conductive paths of the flex circuit, wherein the third contacts of the flex circuit are electrically coupled to the first contacts of the base substrate, and wherein the fourth contacts, the second contacts, the conductive paths, and the third contacts electrically couple the radiation detecting elements of the radiation detecting tile to the first contacts of the base substrate.

14. The device of claim 13, wherein the third contacts of the flex circuit are electrically coupled to the first contacts of the base substrate with one of solder bonding, tape automated bonding, thermosonic bonding, and conductive adhesive bonding.

15. The device of claim 13, wherein at least a portion of the flex circuit is affixed to the carrier substrate.

16. The device of claim 13, wherein the carrier substrate is substantially rigid relative to the flex circuit.

17. The device of claim 13, wherein the flex circuit includes at least one base substrate coupling portion, the third contacts being disposed on the base substrate coupling portion, and wherein the base substrate coupling portion extends to a position proximal to the first contacts of the base substrate.

18. The device of claim 13, wherein the first contacts are disposed on a side of the base substrate opposite the carrier substrate, the base substrate includes at least one aperture, and the base substrate coupling portion extends through the aperture to a position proximal to the first contacts of the base substrate.

19. The device of claim 13, wherein the radiation detecting tile has a first major surface mounted opposite a first major surface of the carrier substrate, wherein the first major surface of the radiation detecting tile has an area larger than an area of the first major surface of the carrier substrate.

20. The device of claim 13, wherein the radiation detecting tile has a first major surface mounted opposite a first major surface of the carrier substrate, wherein the first major surface of the radiation detecting tile has an area approximately equal to an area of the first major surface of the carrier substrate, and wherein sides of the carrier substrate are beveled such that a second major surface of the carrier substrate has an area smaller than the area of the first major surface of the radiation detecting tile.

21. The device of claim 13, wherein at least some of the fourth contacts of the radiation detecting tile are coupled via the second contacts and the conductive paths to common third contacts, and wherein the number of each of the third contacts and first contacts is less than the number of the fourth contacts.

22. A radiation detecting module, the radiation detecting module being mountable over a base substrate with a plurality of other radiation detecting modules to form an array of radiation detecting modules, wherein the base substrate includes a plurality of first electrically conductive contacts, the radiation detecting module comprising:

a carrier substrate having a plurality of second electrically conductive contacts and a plurality of third electrically conductive contacts, the second contacts being electrically coupled to the third contacts of the carrier substrate and being configured for electrical coupling to the first contacts of the base substrate, and a radiation detecting tile mounted over the carrier substrate, the radiation detecting tile having a plurality of radiation detecting elements and a plurality of fourth electrically conductive contacts, the fourth contacts being electrically coupled to the radiation detecting elements and to the third contacts of the carrier substrate, wherein the second, third, and fourth contacts are configured to electrically couple the radiation detecting elements of the radiation detecting tile to the first contacts of the base substrate.

23. A radiation detecting module, the radiation detecting module being mountable over a base substrate with a plurality of other radiation detecting modules to form an array of radiation detecting modules, wherein the base substrate includes a plurality of first electrically conductive contacts, the radiation detecting module comprising:

a carrier substrate disposed in contact with the base substrate, a flex circuit disposed over the carrier substrate, the flex circuit having a plurality of electrically conductive paths, a plurality of second electrically conductive contacts, and a plurality of third electrically conductive contacts, wherein the second contacts and third contacts are coupled to one another via the conductive paths, a radiation detecting tile mounted over the flex circuit, the radiation detecting tile having a plurality of radiation detecting elements and a plurality of fourth electrically conductive contacts, the fourth contacts being electrically coupled to the radiation detecting elements and to the third contacts of the flex circuit via the second contacts and the conductive paths of the flex circuit, wherein the third contacts of the flex circuit are electrically coupled to the first contacts of the base substrate, and wherein the fourth contacts, the second contacts, the conductive paths, and the third contacts electrically couple the radiation detecting elements of the radiation detecting tile to the first contacts of the base substrate.

24. A method for producing a multi-module radiation detecting device, the method comprising the steps of:

providing a base substrate having a plurality of first electrically conductive contacts;

mounting a plurality of radiation detecting modules mounted over the base substrate in an array, each of the radiation detecting modules including:

a carrier substrate having a plurality of second electrically conductive contacts and a plurality of third electrically conductive contacts, the second contacts being electrically coupled to the first contacts of the base substrate and to the third contacts of the carrier substrate, and a radiation detecting tile mounted over the carrier substrate, the radiation detecting tile having a plurality of radiation detecting elements and a plurality of fourth electrically conductive contacts, the fourth contacts being electrically coupled to the radiation detecting elements and to the third contacts of the carrier substrate, wherein the second, third, and fourth contacts electrically couple the radiation detecting elements of the radiation detecting tile to the first contacts of the base substrate.

25. A method for producing a multi-module radiation detecting device, the method comprising the steps of:

providing a base substrate having a plurality of first electrically conductive contacts;

mounting a plurality of radiation detecting modules over the base substrate in an array, each of the radiation detecting modules including:

a carrier substrate disposed in contact with the base substrate, a flex circuit disposed over the carrier substrate, the flex circuit having a plurality of electrically conductive paths, a plurality of second electrically conductive contacts, and a plurality of third electrically conductive contacts, wherein the second contacts and third contacts are coupled to one another via the conductive paths, a radiation detecting tile mounted over the flex circuit, the radiation detecting tile having a plurality of radiation detecting elements and a plurality of fourth electrically conductive contacts, the fourth contacts being electrically coupled to the radiation detecting elements and to the third contacts of the flex circuit via the second contacts and the conductive paths of the flex circuit, wherein the third contacts of the flex circuit are electrically coupled to the first contacts of the base substrate, and wherein the fourth contacts, the second contacts, the conductive paths, and the third contacts electrically couple the radiation detecting elements of the radiation detecting tile to the first contacts of the base substrate.

26. A method for producing a multi-module radiation detecting device, the method comprising the steps of:

assembling a plurality of radiation detecting modules in a two-dimensional array over a support, wherein the two-dimensional array has four peripheral sides, and wherein each of the radiation detecting modules includes:

a carrier substrate having a plurality of first electrically conductive contacts and a plurality of second electrically conductive contacts, the first contacts being electrically coupled to the second contacts, and a radiation detecting tile mounted over the carrier substrate, the radiation detecting tile having a plurality of radiation detecting elements and a plurality of third electrically conductive contacts, the third contacts being electrically coupled to the radiation detecting elements and to the second contacts of the carrier substrate;

applying force to each of the four peripheral sides of the two-dimensional array of radiation detecting modules to align the radiation detecting modules relative to one another;

providing a base substrate having a plurality of fourth electrically conductive contacts;

mounting the base substrate over the array of radiation detecting modules; and electrically coupling the first contacts of the carrier substrate to the fourth contacts of the base substrate, thereby coupling the radiation detecting elements to the fourth contacts via the first contacts, the second contacts, and the third contacts.

27. A method for producing a multi-module radiation detecting device, the method comprising the steps of:

assembling a plurality of radiation detecting modules in a two-dimensional array over a support, wherein the two-dimensional array has four peripheral sides, and wherein each of the radiation detecting modules includes:
a carrier substrate,
a flex circuit disposed over the carrier substrate, the flex circuit having a plurality of first electrically conductive contacts, a plurality of electrically conductive paths, and a plurality of second electrically conductive contacts, the first contacts and the second contacts being coupled to one another via the conductive paths,
a radiation detecting tile mounted over the flex circuit, the radiation detector tile having a plurality of radiation detecting elements and a plurality of third electrically conductive contacts, the third contacts being electrically coupled to the radiation detecting elements and to the second contacts of the flex circuit via the first contacts and the conductive paths of the flex circuit;

applying force to each of the four peripheral sides of the two-dimensional array of radiation detecting modules to align the radiation detecting modules relative to one another;

providing a base substrate having a plurality of fourth electrically conductive contacts;

mounting the base substrate over the array of radiation detecting modules; and electrically coupling the second contacts of the flex circuit to the third contacts of the base substrate, thereby coupling the radiation detecting elements to the fourth contacts via the first contacts, the conductive paths, the second contacts, and the third contacts.

* * * * *